(12) United States Patent
Slotboom et al.

(10) Patent No.: US 10,908,512 B2
(45) Date of Patent: Feb. 2, 2021

(54) METHODS OF CONTROLLING A PATTERNING PROCESS, DEVICE MANUFACTURING METHOD, CONTROL SYSTEM FOR A LITHOGRAPHIC APPARATUS AND LITHOGRAPHIC APPARATUS

(71) Applicant: ASML NETHERLANDS B.V., Veldhoven (NL)

(72) Inventors: Daan Maurits Slotboom, Wolphaartsdijk (NL); Michiel Kupers, Roermond (NL)

(73) Assignee: ASML Netherlands B.V., Veldhoven (NL)

( * ) Notice: Subject to any disclaimer, the term of this patent is extended or adjusted under 35 U.S.C. 154(b) by 236 days.

(21) Appl. No.: 16/061,257

(22) PCT Filed: Dec. 9, 2016

(86) PCT No.: PCT/EP2016/080484
§ 371 (c)(1),
(2) Date: Jun. 11, 2018

(87) PCT Pub. No.: WO2017/108453
PCT Pub. Date: Jun. 29, 2017

(65) Prior Publication Data
US 2018/0373162 A1    Dec. 27, 2018

(30) Foreign Application Priority Data
Dec. 24, 2015 (EP) .................... 15202675

(51) Int. Cl.
*G03F 7/20*    (2006.01)
*G03F 9/00*    (2006.01)

(52) U.S. Cl.
CPC .......... *G03F 7/705* (2013.01); *G03F 7/70525* (2013.01); *G03F 7/70633* (2013.01); *G03F 9/7073* (2013.01)

(58) Field of Classification Search
USPC ....................................... 355/52, 67
See application file for complete search history.

(56) References Cited

U.S. PATENT DOCUMENTS 8,947,630 B2 * 2/2015 Padiy .................. G03F 7/70525
                                                      355/52
8,947,643 B2    2/2015 Padiy et al.
(Continued)

FOREIGN PATENT DOCUMENTS

CN    102163002 A    8/2011
CN    103034067 A    4/2013
(Continued)

OTHER PUBLICATIONS

"Sato et al. Alignment mark signal simulation system for the optimum mark feature selection, 2005, J. Microlith., Microfab., Microsyst, vol. 4(2)" (Year: 2005).*
(Continued)

*Primary Examiner* — Santosh R Poudel
(74) *Attorney, Agent, or Firm* — Pillsbury Winthrop Shaw Pittman, LLP

(57) ABSTRACT

Performance measurement targets are used to measure performance of a lithographic process after processing a number of substrates. In a set-up phase, the method selects an alignment mark type and alignment recipe from among a plurality of candidate mark types by reference to expected parameters of the patterning process. After exposing a number of test substrates using the patterning process, a preferred metrology target type and metrology recipe are selected by comparing measured performance (e.g. overlay) of performance of the patterning process measured by a
(Continued)

reference technique. Based on the measurements of position measurement marks and performance measurement targets after actual performance of the patterning process, the alignment mark type and/or recipe may be revised, thereby co-optimizing the alignment marks and metrology targets. Alternative run-to-run feedback strategies may also be compared during subsequent operation of the process.

20 Claims, 5 Drawing Sheets

(56) References Cited

U.S. PATENT DOCUMENTS

| | | | |
|---|---|---|---|
| 8,976,355 B2 | 3/2015 | Van Der Sanden et al. | |
| 9,291,916 B2 | 3/2016 | Van Der Sanden et al. | |
| 2002/0014601 A1* | 2/2002 | Yoshida | G03F 9/7046 250/548 |
| 2003/0223630 A1* | 12/2003 | Adel | G03F 7/70633 382/145 |
| 2004/0102857 A1* | 5/2004 | Markle | G05B 19/41865 700/2 |
| 2005/0219492 A1* | 10/2005 | Fukada | G03F 9/7084 355/55 |
| 2006/0103822 A1* | 5/2006 | Werkman | G03F 9/7046 355/55 |
| 2008/0076046 A1* | 3/2008 | Willis | G03F 7/40 430/30 |
| 2008/0204696 A1* | 8/2008 | Kamijima | G03F 9/7003 355/77 |
| 2010/0112467 A1 | 5/2010 | Chung | |
| 2011/0205520 A1 | 8/2011 | Padiy et al. | |
| 2011/0216293 A1* | 9/2011 | Padiy | G03F 7/70525 355/52 |
| 2012/0022679 A1* | 1/2012 | Choi | G03F 7/70525 700/108 |
| 2013/0168877 A1 | 7/2013 | Chiu | |
| 2013/0230797 A1 | 9/2013 | Van Der Sanden et al. | |
| 2014/0322831 A1 | 10/2014 | Sentoku et al. | |
| 2015/0025668 A1* | 1/2015 | Ye | B29C 64/393 700/108 |
| 2015/0153656 A1 | 6/2015 | Van Der Sanden et al. | |
| 2015/0185626 A1* | 7/2015 | Chen | G03F 7/705 355/52 |
| 2016/0075076 A1* | 3/2016 | Sato | G03F 7/0002 264/40.5 |
| 2016/0171135 A1* | 6/2016 | Datta | G06F 30/367 716/136 |

FOREIGN PATENT DOCUMENTS

| | | | |
|---|---|---|---|
| KR | 10-2014-0003320 | 1/2014 | |
| WO | 2011/159625 | 12/2011 | |
| WO | 2015/018625 | 2/2015 | |
| WO | 2015/101458 | 7/2015 | |
| WO | 2015/101459 | 7/2015 | |
| WO | 2015/101460 | 7/2015 | |
| WO | 2015/101461 | 7/2015 | |
| WO | WO-2015110210 A1 * | 7/2015 | G03F 9/7046 |

OTHER PUBLICATIONS

International Search Report and Written Opinion issued for International Patent Application No. PCT/EP2016/080484, dated Mar. 27, 2017.
Unknown, "Process Control Optimization Using Mark Deformation Information by a Relative Budget Breakdown," Mason Publications, Hampshire, GB, vol. 584, No. 51, Dec. 1, 2012, 3 pgs.
Unknown, "Process insensitive fine-alignment mark," Mason Publications, Hampshire, GB, vol. 539, No. 19, Mar. 1, 2009, 3 pgs.
Korean Office Action issued in corresponding Korean Patent Application No. 10-2018-7021309, dated Feb. 21, 2020.
Office Action dated Nov. 18, 2019 issued in corresponding Chinese Patent Application No. 201680076245.X.

* cited by examiner

METHODS OF CONTROLLING A PATTERNING PROCESS, DEVICE MANUFACTURING METHOD, CONTROL SYSTEM FOR A LITHOGRAPHIC APPARATUS AND LITHOGRAPHIC APPARATUS

CROSS-REFERENCE TO RELATED APPLICATIONS

This application is the U.S. national phase entry of PCT patent application no. PCT/EP2016/080484, which was filed on Dec. 9, 2016, which claims the benefit of priority of European patent application no. 15202675.3, which was filed on Dec. 24, 2015, and which is incorporated herein in its entirety by reference.

BACKGROUND

Field of the Invention

The present invention relates to control apparatus and control methods usable, for example, to maintain performance in the manufacture of devices by patterning processes such as lithography. The invention further relates to methods of manufacturing devices using lithographic techniques. The invention yet further relates to computer program products for use in implementing such methods.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Prior to applying patterns to a wafer using a lithographic apparatus, the wafer generally needs to be measured and modeled so as to properly align the wafer and to correct wafer deformations during patterning. A critical performance measure of the lithographic process is overlay, the accuracy of alignment of features in two layers in a device (or between features formed by two patterning steps in the same layer). Alignment sensors having multiple color channels are used in the known lithographic apparatus, to try and obtain the best possible position measurements prior to patterning. These position measurements are used to calculate a substrate model for each wafer.

To improve overlay, and other parameters, additional measurements are made of performance on prior substrates that have been patterned, to identify and correct deviations introduced in the patterning step and/or other steps. Various tools for making such measurements are known, including scanning electron microscopes (SEM), which are used to measure performance parameters such as overlay. However, SEM measurements are too time-consuming to be performed on a significant proportion of substrates in high-volume manufacture. Recently, various forms of scatterometers have been developed for use in the lithographic field, which allow high volume measurements. Typically these measurements made over many prior substrates, and continuous control of performance is achieved in a so-called advanced process control (APC) system. The success of the advanced process control depends however on the accuracy of measurement of the performance parameter of interest. In current practice, during the development of a new process, a number of different target types may be considered. A number of different target types may be provided on a number of test substrate. Similarly, metrology sensor settings are also varied, to obtain the optimum combination of target type and metrology sensor response. A set of metrology sensor settings can be called a "metrology recipe", for simplicity.

Automated methods for predicting the most likely candidate target designs are described for example in the published patent applications WO 2015101458 A1, WO 2015101459 A1, WO 2015101460 A1 and WO 2015101461 A2 Performance indicators such as TMU (total measurement uncertainty) and stack sensitivity are determined by simulation and/or experiment to determine the accuracy of metrology performance. However, these performance indicators are not directly related to the performance of the manufactured devices. Differences will arise between properties of the experimental samples or products when they are made, and the properties that were simulated when designing the metrology targets. Accordingly, the best combination of target type and metrology sensor recipe is often not achieved at the first attempt. And optimization is often done on iterative basis. The search for optimum parameters is a multidimensional problem and product substrates have to be processed and measured by one or more reference techniques, before their performance can be checked and compared with the performance predicted by the metrology sensor. This is extremely time-consuming and gives no guarantee of an accurate outcome. Reference techniques for this purpose include, for example, SEM (scanning electron microscopy), TEM (transmission electron microscopy), AFM (atomic force microscopy), and an asymmetry-base technique disclosed in published international patent application WO 2015018625 A1.

Across the many different product designs and process variations that are encountered in a manufacturing facility, different metrology target designs and different metrology methods for each design will be required to obtain the best performance. Therefore, when developing a new process, or changing a process, and optimization process is undertaken in order to select the best combination of metrology targets and metrology recipes for a particular application. There are variations between processes, including between product designs and between layers in a product design. There are also variations between lots and between substrates, depending on the consistency of performance of a lithographic apparatus and associated apparatuses.

Additionally, prior to exploring the different metrology target types and recipes, it is conventional to determine the design of alignment targets, and an alignment sensor response, that will be used to obtain position measurements in the lithographic apparatus. Using these position measurements, an alignment model of each substrate is obtained, for use in positioning a new layer pattern in a desired positional relationship with an existing pattern. Optimization of alignment design and alignment sensor response (alignment recipe) is generally performed in a setup phase prior to optimization of metrology targets. On the other hand, the overall performance of the manufacturing method is not only affected by the accuracy of measuring performance on metrology targets, but also the accuracy of measuring alignment marks and on correlations between errors in the two types of measurement. Conventional methods for optimizing performance are limited to optimization of metrology target design and metrology recipe, given a previously optimized alignment mark and alignment recipe. No account is taken of the possibility that, for a given application, a different alignment mark and/or alignment recipe could be combined with a different metrology target design and/or recipe to obtain better performance overall.

It will be appreciated that the alignment mark types and metrology target types available in the production process to be controlled will be determined by what is provided on the patterning device (reticle). Unless this is a programmable patterning device, the opportunities to change the alignment type and metrology target type will be very limited indeed. It may be that changes can only be made when a new product generation is under development. In a development phase, test patterns having many different variations of alignment marks and metrology targets can be provided. In a finished product design, limited space in the device layout will restrict substantially the number of marks and targets that can be allowed.

Yet another parameter of the control system to be optimized is the choice of "alignment tree". The alignment tree is another part of the lithographic process control recipe that determines, for a new layer, which previous layer's alignment marks should be used to position the pattern being applied in a new layer. Often potentially suitable alignment marks could be found in more than one layer.

In the known methods of setting up a new process, a particular strategy for feeding back historic performance measurements to calculate new process corrections will be determined. This so-called "run-to-run" control strategy is typically set at an early stage in the development of a new process, when limited real-world data is available. Consequently, as time goes by, it becomes unknown whether the chosen strategy is in fact the optimal one for the production process in question. It could always be that a different run-to-run control strategy would actually yield better results.

SUMMARY OF THE INVENTION

The present invention aims to improve systems for control of performance in parameters such as overlay in lithographic processes. The inventors have recognized that improved performance can be integrating different optimizations that have been implemented in isolation up to now. As a particular example, the invention provides co-optimization of alignment mark type and alignment recipe, together with metrology target type and metrology recipe.

In another aspect, the invention aims to enable optimization of from to run control strategies during high-volume manufacture.

According to a first aspect of the present invention, there is provided a method of controlling a patterning process wherein performance measurement targets are used to measure performance of the patterning process after processing a number of substrates, wherein the method further comprises, in a set-up phase, (i) selecting a type of position measurement mark for the patterning process from among a plurality of candidate mark types by reference to expected parameters of the patterning process;

(ii) applying a test pattern to a number of substrates using the patterning process, the pattern including a plurality of candidate types of performance measurement targets; and (iii) selecting a preferred candidate type of performance measurement target by comparing performance of the patterning process as measured using the different types of performance measurement targets with performance of the patterning process measured by other means, and wherein the method in the set-up phase yet further comprises:

(iv) based on the measurements of position measurement marks and performance measurement targets after actual performance of the patterning process in step (ii), revising a selection of position measurement mark type used in the patterning process for measuring positional deviations across the substrate.

The patterning process being controlled may for example comprise:

(a) measuring positions of a number of position measurement marks provided on a substrate;

(b) using the measured positions to define a substrate correction;

(c) using the substrate correction in controlling a patterning process to apply a pattern to the substrate;

(d) using a number of performance measurement targets included in the applied pattern, measuring a performance parameter of the patterning process; and (e) after processing a number of substrates, using the measured performance parameters to calculate a process correction and using the process correction together with the substrate correction in step (c).

The invention further provides a control system for a lithographic apparatus, the control system comprising:

storage for historical performance measurements representing performance of a patterning process in applying patterns to a plurality of prior substrates; and a processor for using said historical performance measurements together with position measurements made on a current substrate to control a patterning process, the control system further comprising in an optimization system:

a module for selecting a type of position measurement mark for the patterning process from among a plurality of candidate mark types by reference to expected parameters of the patterning process;

a module for selecting a preferred candidate type of performance measurement target from among a plurality of candidate types of performance measurement targets applied to one or more substrates by comparing performance of the patterning process as measured using the different types of performance measurement targets with actual performance of the patterning process measured by other means, and a module based on the measurements of position measurement marks and performance measurement targets after actual performance of the patterning process for revising the selection of position measurement mark type used for measuring positional deviations across the substrate.

The various storage, controllers and processors of the control system are identified by their functions in the above summary, and two or more of these functions may be implemented using common hardware. They may in particular be implemented by programming one or more processors and controllers already present within a lithographic apparatus, an advanced process control system and/or a metrology system.

The invention in a second aspect provides method of controlling a patterning process wherein after processing a number of substrates, measured performance parameters are used to calculate a process correction, the process correction being used in applying a pattern to a series of new substrates, and wherein said process correction is progressively updated in response to measured performance parameters from newly processed substrates, in accordance with a selected performance feedback strategy, the method further comprising:

(i) in parallel with controlling performance of the patterning process using the selected performance feedback strategy, calculating alternative process corrections according to one or more alternative performance feedback strategies, and (ii) comparing achieved performance of the patterning process using the selected performance feedback strategy with simulated performance of the patterning process using the alternative performance feedback strategies and switching to an alternative performance feedback strategy whose simulated performance would have been better than the achieved performance.

The invention yet further provides a method of manufacturing devices wherein device features and metrology targets are formed on a series of substrates by a patterning process, wherein properties of the metrology targets on one or more processed substrates are measured by a method according to the first and/or second aspect of the invention as set forth above, and wherein the measured properties are used to adjust parameters of the patterning process for the processing of further substrates.

The invention yet further provides a lithographic apparatus including a control system according to the second aspect of the invention as set forth above.

The invention yet further provides a computer program product containing one or more sequences of machine-readable instructions for implementing calculating steps in a method according to the invention as set forth above.

These and other aspects and advantages of the apparatus and methods disclosed herein will be appreciated from a consideration of the following description and drawings of exemplary embodiments.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Before describing embodiments of the invention in detail, it is instructive to present an example environment in which embodiments of the present invention may be implemented.

Figure 1:
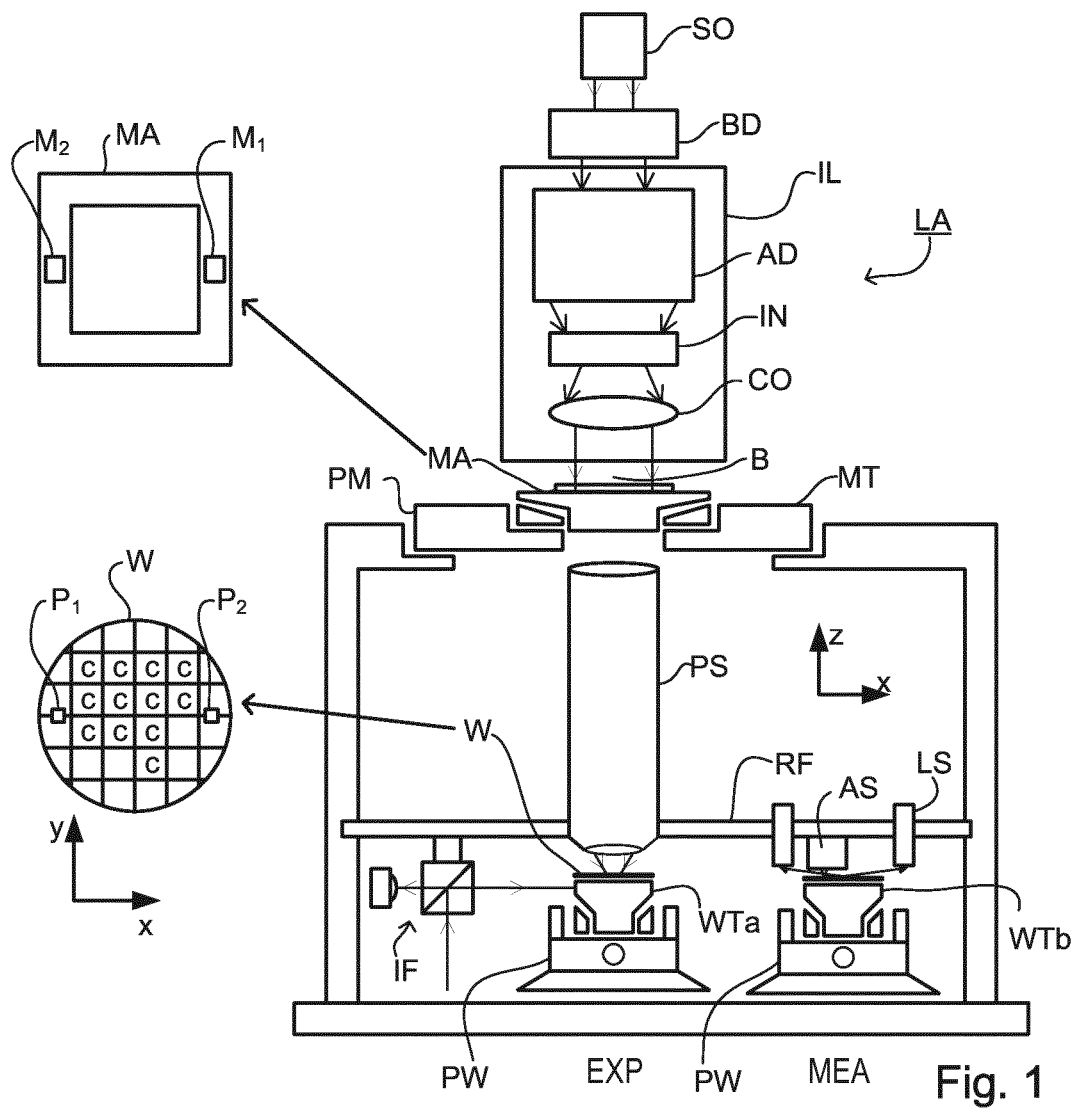
FIG. 1 depicts a lithographic apparatus suitable for use in an embodiment of the present invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation. For example, in an apparatus using extreme ultraviolet (EUV) radiation, reflective optical components will normally be used.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the markers be as small as possible and not require any different imaging or process conditions than adjacent features. The alignment system, which detects the alignment markers, is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
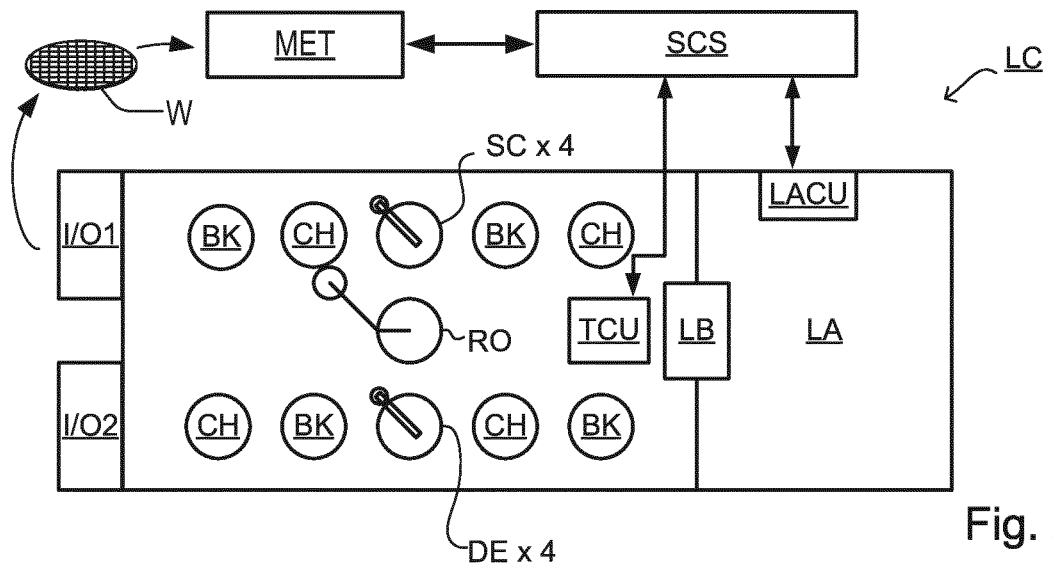
FIG. 2 depicts a lithographic cell or cluster in which an inspection apparatus according to the present invention may be used.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it may be desirable that the inspection apparatus measure properties in the exposed resist layer immediately after the exposure. However, not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image at which point either the exposed or unexposed parts of the resist have been removed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

The metrology step with metrology system MET can also be done after the resist pattern has been etched into a product layer. The latter possibility limits the possibilities for rework of faulty substrates but may provide additional information about the performance of the manufacturing process as a whole.

Alignment Process Background

Figure 3:
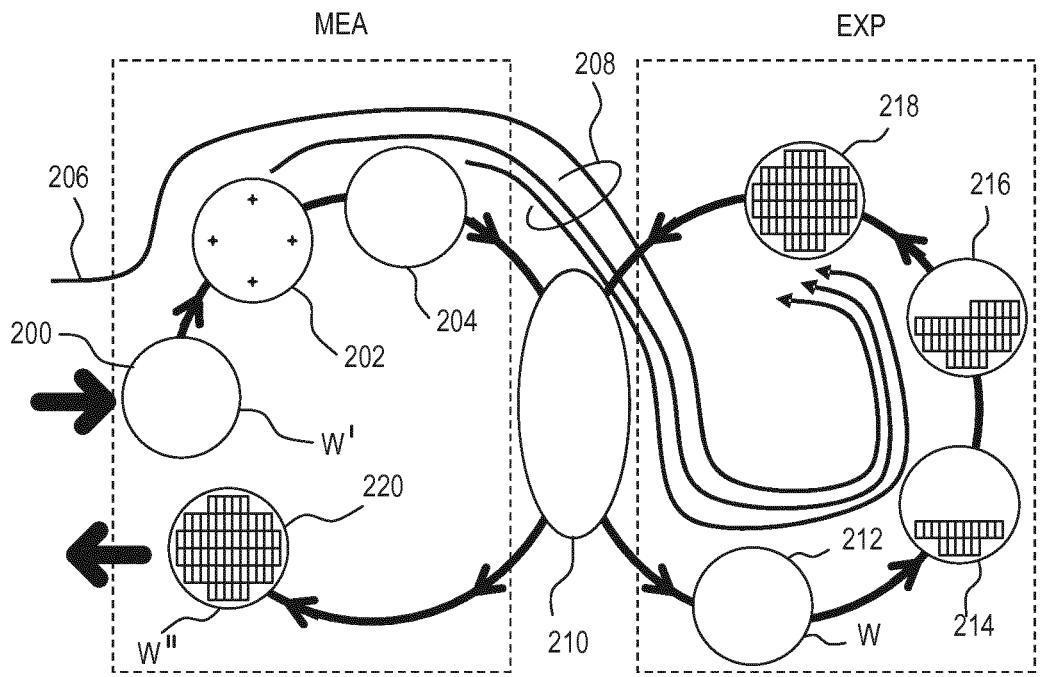
FIG. 3 illustrates schematically measurement and exposure processes in the apparatus of FIG. 1, according to known practice.

FIG. 3 illustrates the steps to expose target portions (e.g. dies) on a substrate W in the dual stage apparatus of FIG. 1. The process according to conventional practice will be described first. The present disclosure is by no means limited to dual stage apparatus of the illustrated type. The skilled person will recognize that similar operations are performed in other types of lithographic apparatus, for example those having a single substrate stage and a docking metrology stage.

On the left hand side within a dotted box are steps performed at measurement station MEA, while the right hand side shows steps performed at exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. Each patterning step can introduce positional deviations in the applied pattern, while subsequent processing steps progressively introduce distortions in the substrate and/or the pattern applied to it, that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation. Some layers may be patterned by steps that are alternative or supplementary to exposure in the illustrated lithographic apparatus. Such alternative and supplementary techniques include for example imprint lithography, self-aligned multiple patterning and directed self-assembly.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a substrate model (sometimes referred to as the "wafer grid"), which maps very accurately the distribution of marks across the substrate, including any distortion relative to a nominal rectangular grid.

At step 204, a map of wafer height (Z) against X-Y position is measured also using the level sensor LS. Primarily, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. Where there is a choice of alignment marks on the substrate, and where there is a choice of settings of an alignment sensor, these choices are defined in an alignment recipe among the recipe data 206. The alignment recipe therefore defines how positions of alignment marks to be measured, as well as which marks. The set of alignment recipes for all the layers form the alignment tree, as mentioned above. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. As described further in US 2013230797A1, advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

Advanced Process Control Using Performance Data

Figure 4:
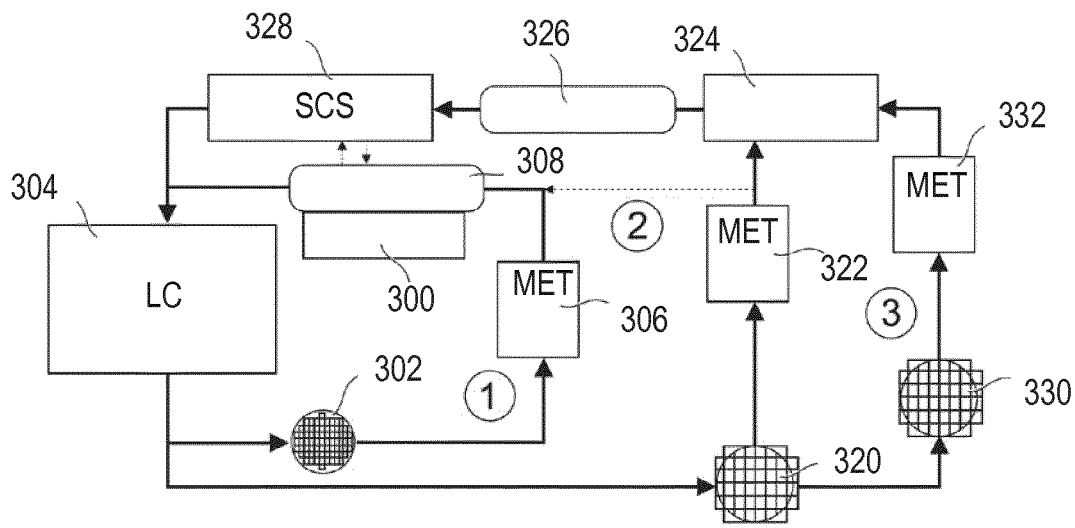
FIG. 4 is a schematic diagram of an advanced process control method for controlling the apparatus of FIG. 1 according to known practice.

For best performance, historical performance data relating to the lithography process are generally used in addition to measurements made when a current substrate is loaded into the lithographic apparatus. For this purpose, measurements of performance are made with the metrology system MET (FIG. 2). Different forms of advanced process control can be implemented. FIG. 4 illustrates only one example of process control, and shows at least part of an implementation of a known stability control method.

FIG. 4 depicts a stability module 300. This module is for example an application running on a processor, for example within the control unit LACU or the supervisory control system SCS of FIG. 2. Shown are three main process control loops, labeled 1, 2, 3. The first loop provides local control of the lithography apparatus using the stability module 300 and monitor wafers. A monitor wafer 302 is shown being passed from a lithography cell 304, which may be the lithocell LC of FIG. 2 for example. Monitor wafer 304 has been exposed with a calibration pattern to set 'baseline' parameters for focus and overlay. At a later time, a metrology tool 306 reads these baseline parameters, which are then interpreted by the stability module 300 so as to calculate stability corrections 308 specific to this lithocell. This performance data can be fed back to the lithography cell 304, and used when performing further exposures. The exposure of the monitor wafer may involve printing a pattern of marks on top of reference marks. By measuring overlay error between the top and bottom marks, deviations in performance of the lithographic apparatus can be measured, even when the wafers have been removed from the apparatus and placed in a metrology tool.

The second (APC) control loop is based on measurements of performance parameters such as focus, dose, and overlay on actual product wafers. An exposed product wafer 320 is passed to metrology tool 322, which may be the same or different to the metrology tool 306 in the first control loop. At 322 information relating for example to parameters such as critical dimension, sidewall angles and overlay is determined and passed to an Advanced Process Control (APC) module 324. This data is also passed to the stability module 300. Process corrections 326 are calculated and used by the supervisory control system (SCS) 328, providing control of the lithocell 304, in communication with the stability module 300.

The third control loop is to allow metrology integration into the second (APC) control loop, for example in double patterning applications. An etched wafer 330 is passed to metrology unit 332 which again may be the same or different to the metrology tool 306, 322 used in the first and/or second control loop. Metrology tool 332 measures performance parameters such as critical dimensions, sidewall angles and overlay, read from the wafer. These parameters are passed to the Advanced Process Control (APC) module 324. The loop continues the same as with the second loop.

In each case, where there is a measurement to be made, the choice of metrology target type will have been made in the development of the manufacturing process that is being controlled. Moreover, detailed optimization of the metrology target design and metrology recipe may have been performed using simulations of the type described in the prior patent applications listed above. A metrology recipe associated with the APC process or the manufacturing process generally can be provided to define which targets measured for which parameters, and what settings of the scatterometer or other sensor are to be used for each target. A scatterometer may, for example, offer a choice of illumination profiles, wavelengths, polarization etc. All of these parameters, as well as the manner of analyzing any captured scatter diffraction patterns, can be specified in a metrology recipe.

Integrated Optimization Method

Figure 5:
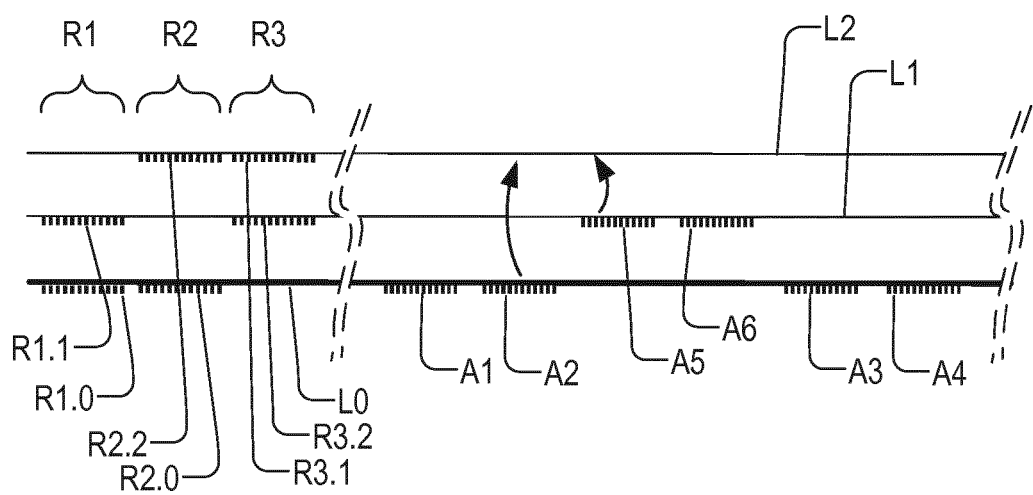
FIG. 5 illustrates the provision of multiple alternative alignment marks and alternative metrology targets in a substrate used in a method according to an embodiment of the present invention.

FIG. 5 illustrates schematically an arrangement of multiple metrology targets multiple alignment marks on a substrate. The substrate has been processed to form three layers L0, L1, L2. These may not be the only layers on the substrate, and in particular there may be intervening layers between these, presenting challenges for measurement of mark position and performance. Although only the alignment marks and metrology targets are shown, product features, either real production product features or experimental product features will be defined in patterns elsewhere on the substrate. Alignment marks A1 to A6 provided in one or more layers for use by the lithographic apparatus in measuring positional deviations across the substrate, so that patterns in a subsequent layer can be applied in the correct position. In the illustrated example, alignment marks A1 to A4 are in the lowest layer L0, while alignment marks A5 to A6 are in the layer L1. Within each layer, the different alignment marks may be formed with a different design, so that a best design can be chosen and used to measure positions for applying patterns in a subsequent layer.

The accuracy with which position can be determined using a mark in a lower layer will depend on intervening layer materials under which it is buried. The buried mark may also have been deformed by process steps forming those intervening layers, so as to give unreliable position readings. The choice of mark type and the alignment recipe will be made to obtain the best measurement possible in those circumstances, may therefore be different in different circumstances.

The alignment tree is another dimension or dimensions of the whole alignment and metrology system that should be to be optimized for best performance control. As illustrated by the curved arrows, there is a choice, when applying a pattern to layer L2, whether to use an alignment mark in layer L0 as a reference, or to use a mark in layer L1. A combination of these marks may even be used. Sequence of marks used for different layers in the course of manufacturing a product is known as the alignment tree. The alignment tree forms one part of an alignment recipe in a fully developed process. Bearing in mind that a real product may have 30 or 40 patterning steps to be performed, the number of degrees of freedom in defining the alignment tree can be very substantial, making the optimization process rather unreliable, by current methods.

Also shown in FIG. 5 are three metrology targets R1, R2, R3. In this example, all of these metrology targets are overlay targets, designed for measuring the accuracy of alignment of patterns between two or more layers. Other types of metrology targets can also be provided for measuring other parameters of performance of the manufacturing process. In the example, overlay target R1 comprises a bottom grating R1.0 in layer L0 and a top grating R1.1 in layer L1. Overlay target R1 is therefore adapted for measuring overlay error between layers L1 and L0. Overlay target R2 comprises a bottom grating in layer L0 and a top grating in layer L2. Overlay target R3 comprises a bottom grating in layer L1 and a top grating in layer L2. To measure overlay of the layer L2, one can choose to measure overlay relative to layer L1, using overlay target R3, or to measure overlay relative to layer L0, using overlay target R2. Therefore, in the same way as there is an alignment tree defining the measurement of alignment prior to applying a pattern to a given layer, so there is an overlay tree, defining the measurement of overlay to be made when measuring performance of the process after that layer has been patterned. At least in an experimental substrate, it may be supposed that each of these targets is provided in a variety of types, one of which may be optimal in one set of circumstances and another may be optimal in another. Therefore in this example there is a choice of two overlay targets for measuring overlay between those two layers. These targets can be made of different types, and experiments performed to determine which provides the better measurement in the real process.

It will be understood that alignment marks and metrology targets of this type can be provided in a far greater variety than illustrated in this simple example, and will be provided at many points across the substrate, and across each target portion (field) on an experimental substrate, or product substrate. While the alignment marks and metrology targets are shown as separate in this example, it will be appreciated that a bottom grating (or a top grating) of an overlay target may also be used as an alignment mark in a given exposure step. Consequently, the designation of certain structures as alignment marks does not exclude that they are part of a metrology target, and vice versa.

Given that there may be tens of layers, there may be tens of alignment mark different market types and alignment recipes, and tens of different metrology target designs and tens of different metrology recipes, it will be recognized that the "metrology space" in which an optimal combination of all these variants should be found is a vast multidimensional space. In the case of alignment recipes, known alignment sensors AS allow multiple signals to be captured in parallel, so that multiple recipes can be compared from one capture operation. In the case of scatterometers for overlay measurement and the like, generally speaking the metrology recipe specifies different illumination conditions in terms of wavelength, polarization and angular profile. Consequently, to explore the variety of metrology recipes for a variety of metrology targets is extremely time-consuming.

Figure 6:
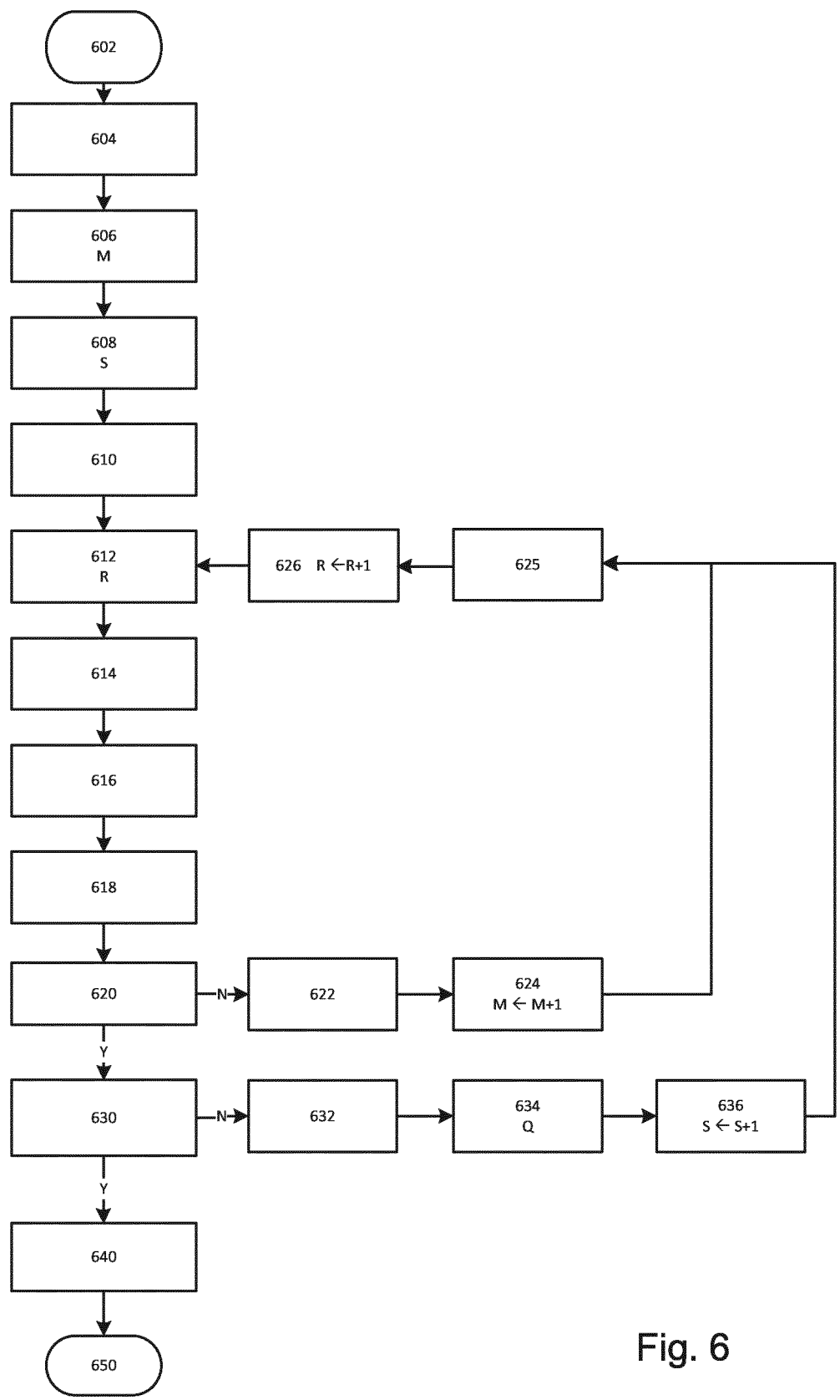
FIG. 6 is a flowchart of a method of co-optimizing alignment mark types, alignment recipes, metrology target types, metrology recipes, alignment trees and run-to-run control strategies in accordance with an embodiment of the present invention.

FIG. 6 illustrates a co-optimization method will now be described that has, in one experiment, reduced the optimization time from more than 100 of hours by known methods, to just a couple of hours by the following automated method. Moreover, after obtaining such a reduction in the development phase of a new process, the method of FIG. 6 continues to optimize parameters of the control system throughout a production phase. Known methods provide very limited opportunity to revise the optimization during production.

In one embodiment of the invention, a development phase comprises the following steps. The steps are undertaken under control of a suitable program running in one or more data processing apparatuses. The optimization flow starts at step 602. At 604, a preliminary optimized set of n different alignment marks are designed based on information of the intended process. Tools such as the ones described in the patent applications cited in the introduction can perform this step, simulating the performance of alignment sensors under different recipes.

The optimization process in step 604 compares the performance of targets from multiple layers, and selects the mark type and layer that results in the best position measurement in the layers of interest. Based on knowledge of the intended manufacturing process, the alignment mark optimization is performed with the following criteria:

"Printability", meaning the ability of the lithographic tool with all its particular imaging settings to reproduce the candidate alignment mark on a substrate.

Accuracy, meaning the degree to which patterning and processing of the alignment mark will be close to the printing and patterning of the actual product structures whose quality is of ultimate interest.

Robustness, meaning insensitivity of measured position with expected variations in the production process, between wafers and across a wafer.

Based on these criteria, at step 606 an initial mark type M=1 is chosen. In practice several candidate marks are chosen to be produced in experimental wafers. This may be two, three, 10 or more marks, if desired. The optimization of the alignment mark in terms of printability and accuracy is specific for a particular layer. The optimization of the alignment mark in other respects can be done for multiple superseding layers which are to align to alignment layer in accordance with the alignment tree (defined below). Also at this stage, an initial choice of alignment recipe can be chosen. The choice of recipe will normally be varied (optimized) in later steps of the method.

At 608, an initial set S=1 of run-to-run strategy settings is determined. These are settings of the strategy for determining so-called process corrections, which are generated by the APC control loops illustrated in FIG. 4. The strategy settings determine the algorithms to be applied in combining various historic performance measurements to arrive at a new correction. The choice of strategy affects the accuracy and stability of the control loop. A control loop that responded to every individual fluctuation in performance would exaggerate noise in the system undesirably. A control loop that averages far too many historical measurements before making a change may be too slow at correcting systematic errors. There may be multiple process corrections calculated in parallel. For example, it is known to apply higher order process corrections such as third or fifth order polynomial models, both on and inter-field and intra-field basis. The inter-field and intra-field components of the process correction can each have their own control strategy. Individual parameters of a process model may have their own control strategy, for example magnification in the X direction may have a different control strategy from magnification in the Y direction, and so forth.

Candidate run-to-run strategies that may be considered in step 608 are, for example:

A moving average of a certain number of past lots.
An enhanced weighted moving average, placing greater weight on the most recent lots.
Static corrections that are applied only on command.

It will be understood that each of these types of strategy is further variable according to parameters such as how many lots are included in a moving average, and what weighting profile is applied. What does not exist in known systems is an automated method for determining the optimal run-to-run strategy in advance. In the development phase of a new process, there is no historic performance information on which to base any more systematic optimization of run-to-run strategies. Accordingly, the candidate strategy is likely to be selected by the human operator, loosely based on past experience.

At 610, a metrology target optimization is performed. A preliminary optimized set of m different overlay targets are designed based on information of the intended process.

Tools such as the ones described in the patent applications cited in the introduction can be used to perform step 610, simulating the performance of metrology tools under different recipes. At this preliminary stage, the design is done in the conventional manner, without regard to the specific choices of alignment mark types and alignment recipes, which will be co-optimized in the later steps.

Based on knowledge of the intended manufacturing process, the metrology target optimization is performed with the following criteria, already defined above in relation to the alignment marks:

Printability.
Accuracy.
Robustness.

Based on these criteria, at step 610 an initial metrology target type R with associated metrology recipe is chosen and output at step 612. With regard to multiple layers, a complete alignment tree with mark types and recipes for each layer may be specified. In practice several candidate marks are chosen to be produced in experimental wafers. This may be a few or many different target types and recipes, if desired. As noted above, however, the time cost in measuring each metrology target may be much greater than the time cost of measuring extra alignment marks.

Step 614, a number of wafers are printed with patterns in two or more layers, using the lithographic apparatus and lithocell of FIGS. 1 and 2. In particular, the alignment mark type or types determined in step 606 are used to print the metrology targets of the various type or types determined in step 612. Product test patterns may be printed alongside the alignment marks and metrology targets. With regard to the different alignment mark types and potentially different recipes under consideration, the same pattern may be printed many times with different combinations of alignment mark types and alignment recipes. This may require a relatively large number of sample wafers. Depending on the types of patterns designed, however, it is known to apply patterns by multiple exposures on the same wafers, shifting the pattern each time.

After developing the wafers, and optionally etching the exposed patterns, in step 616 the metrology apparatus, for example an angle-resolved scatterometer, is used to measure overlay as a parameter of performance of the lithographic process. This measurement is done the same way as it will be in the high volume APC control loops of FIG. 4, except that in this development phase multiple different overlay target types may be measured, and each will be measured using multiple different recipes. In one type of scatterometer, for example, it may be possible to measure diffraction patterns using seven different wavelengths of radiation, and two different polarizations for each wavelength. Thus, if there are seven wavelengths, two polarizations and m different target types, the time taken for these measurements will be 7×2×m times the time taken for one measurement, per measurement point. Measurement points will be distributed across the wafer, and a number determined by the feedback model implemented in the APC system. For example, using a third order polynomial model of the type mentioned above, around 100 points across the wafer may be sufficient, or 200 for extra noise immunity.

While the wafers printed in step 614 may be wafers with test patterns dedicated to the development of the process, they should be printed using process steps is closest possible equal to the finished production process that is being developed, and with product-like structures. The wafers printed in step 614 may be already product patterns using actual production reticles. The number of available alignment mark types and metrology mark types that can be fitted on such a wafer may be smaller than in the case of a dedicated experimental wafer, but optimization can still be performed, making the most of whatever degrees of freedom there are. Moreover, even if it is found that optimization would require a design of alignment mark and/or overlay target that is not present on the production reticle, plans can be made to implement the optimized structures at the next revision.

At step 618, the overlay measurements obtained using the candidate overlay targets and recipes (metrology data) are compared with "real" overlay values measured by a reference technique (reference data). Reference techniques for this purpose might include, for example, SEM (scanning electron microscopy) and/or TEM (transmission electron microscopy) and/or AFM (atomic force microscopy), all known in the art. Another technique that can be used as a reference technique (either alone or in combination with those just mentioned) is disclosed in published international patent application WO 2015018625 A1. Disclosed there is a technique in which a deliberate asymmetry is introduced in the target or mark in two opposite directions. Given the known asymmetry, a virtual "no asymmetry" situation can be reconstructed and used for control. Whichever reference technique is chosen provides a direct measurement of overlay, but is not suitable for performing the high volume of measurements required in the production process. The overlay measurements obtained using the overlay targets can be performed in high-volume, but are only indirectly representative of the parameter of interest (overlay). Statistical methods are applied to the two sets of measurements before they are compared to identify the optimum combination of metrology target and metrology recipe.

In one embodiment, the statistical analysis in step 618 produces a first multivariate analysis of the multidimensional data set that is formed by the numerous different overlay measurements of the metrology targets, made at multiple points across each wafer and across multiple wafers, and made using different combinations of metrology target type and metrology recipe. A second multivariate analysis is performed on the "real" or reference measurements, which are regarded as setpoints for the optimization process. To implement the first multivariate analysis, for example, a principal component analysis (PCA) may be performed on the metrology data set. PCA analysis decomposes the data set into a number of multidimensional component vectors. Similarly, to perform the second multivariate analysis PCA can be applied to the reference data (setpoint data) to decompose that multidimensional data set into component vectors.

At 620 the results of the two multivariate analyses are compared to identify a metrology target and recipe combination which has the best correlation between the overlay reported in the metrology data and the overlay measured but the reference technique. As one possible implementation of this comparison, one can correlate the variation in metrology data with variation in alignment data. For the variation to be minimized, the offset (or distance in terms of PCA) should be constant. In an example of this method, the best combination of metrology target type and metrology recipe is identified as the one which has the least variation between its overlay values and those reported by the reference technique. PCA is effectively a coordinate transformation to show where the most variation in a data-set lies. This wafer-to-wafer variation in overlay measurement error is of greater interest than a more systematic error that can be corrected in the process model or other calibration Minimizing this "distance" reduces the variation observed in the real world. Any type of data described in the real world by the same parameters can be added in the same PCA space. Hence multiple alignment mark types and measurements results can be added, whether they are simulated or actual measurements using different recipes.

At 620, it is determined whether the minimum distance identified in step 618 is too large to represent a final optimized combination. In a conventional situation, if overlay performance does not reach a specified level, a new instance of the product mask needs to be made. This results in a major loss in development time. The disclosed method therefore searches first for workable alternatives such as switching to backup mark types already present on the mask, and/or changing recipes. More specifically, given the found overlay target type and metrology recipe, step 620 then determines the optimal alignment mark type, alignment model and alignment recipe such that variation of overlay is minimal. Assuming that multiple results exist per metrology target, or even multiple metrology targets are measured, then this step effectively can implement a co-optimization of the alignment strategy and the overlay measurement strategy.

If the minimum distance found is still too large, flow passes to step 622, where the alignment target optimizer is run again in a manner similar to step 604. While the processing is similar to that done in step 604, the data on which that processing is based is now including the measurements made on the actual wafers printed in step 614. Accordingly, at step 624, a new optimal mark type M+1 can be determined.

Having changed the alignment mark type, flow passes to step 625, where a metrology target optimization is again performed, in a manner similar to step 610, but with the new alignment mark type. At 626, as a result of optimization step 625, a new metrology target design is established, in combination with an optimal recipe and alignment tree.

It may be noted that it is common practice to evaluate different alignment marks and recipes against overlay data measured by the metrology apparatus, to optimize the alignment marks and recipes. In that case, however, the overlay reported by the metrology apparatus is regarded as the setpoint. By contrast, in the method above, "real" overlay values measured by an independent reference technique are used as the setpoint. Both the metrology targets and metrology recipes and the alignment marks and alignment recipes can be optimized together, in the above method. In cases where there is a choice of alignment marks and recipes for one or more subsequent layers, step 612 can include step-by-step optimization of the alignment mark type and alignment recipe, to arrive a complete optimized alignment tree.

While the co-optimization is performed by sequentially revising alignment marks and metrology targets in the iterative loops illustrated in FIG. 6, this sequential approach is not the only possible approach. A sequential approach is suitable in a system where not all data is available at the time decisions need to be made. In future systems, the alignment sensor and the metrology sensors may become more complex and/or similar to one another, or even the same instrument. In such a case, the revising of alignment mark type and metrology mark type can be combined into a single co-optimization calculation.

In addition to variations of mark types and recipes, the positions of alignment marks and metrology targets can also be varied and co-optimized as part of the process. The co-optimization process for overlay performance control may be coupled to optimization of performance control in other parameters, for example, focus. For example, targets for focus metrology may compete for space with metrology targets for overlay, and/or with alignment marks. Co-optimization of all these variables can be implemented, to ensure that (for example) improved overlay performance does not come at the expense of degraded focus performance.

Assuming that a satisfactory distance is found at step 620, the method in the development phase is complete. Control passes to step 630, where optimization continues now in the production phase. In the production phase, high volumes of wafers are processed in lots. For example, a lot may comprise 25 wafers. Each lot will be processed by a high-performance lithographic apparatus within a few minutes, including for each wafer the entire cycle illustrated in FIG. 3.

In the outer loop illustrated in FIG. 6, the optimization of a run-to-run control strategy is implemented. A data processing apparatus is programmed to determine which feedback strategy, out of a number of possible candidates, results in the best possible overlay for the products and layers of interest. There are several components to the run-to-run (R2R) optimization system implemented in the present embodiment:

- a first module is provided to calculate what overlay would have been achieved, if a different R2R strategy had been applied than one currently in operation.
- a second module runs in parallel with the APC control system of FIG. 4 and calculates new process corrections using several alternative R2R feedback strategies. These process corrections are calculated but not applied controlling the production process. However, after several lots have been processed through the lithographic apparatus and measured by the metrology system MET, the module compares the alternative strategies to the one currently in operation, and reports which of them would have achieved the best overlay performance.

The above modules can be implemented in different computer systems of the production facility, for the set-up phase and/or production phase. In the production phase, the outer feedback loop in particular will function to perform run-to-run control strategy optimization, as will be described below with reference to FIG. 7. The first module and/or the second module may also calculate whether overlay performance would have been better if some lots had not been included in the calculation of process corrections. These lots are then tagged as "outlier lots". Based on this determination of outlier lots, the system will determine whether each particular outlier lot would have been detected by an outlier detection algorithm operating on the alignment data, prior to patterning the substrate.

Outliers are important, because the feedback system implemented for advanced process control works well only on slowly varying data. It is important to avoid putting noisy data into the R2R control system. To detect outlier lots, the modules may operate in different ways. One way to identify outliers is to analyze the overlay measurements from the metrology system and mark those whose overlay falls outside a normal distribution threshold. Another way to identify outliers is to use the alignment data measured by the alignment sensor of the lithographic apparatus prior to applying a pattern on the substrate. Wafers showing a high positional deviation, especially for example large residuals not corrected by an alignment model, can be marked as outliers. Although alignment and overlay are not the same, alignment is a predictor for overlay, statistically. Moreover, the second method has the advantage that alignment data is available for every wafer, whereas the overlay metrology data may be available only for a few sample wafers per lot. Whichever method is chosen, the threshold of outlier detection is in itself a parameter of the R2R control strategy that can be optimized by the methods described herein.

Returning to the flowchart of FIG. 6, one embodiment of an R2R optimization method is implemented by the outer feedback loop, starting at step 630. At 630, it is tested whether the currently selected R2R control strategy is the optimum one, given the currently used combination of alignment marks, metrology target, alignment recipes and metrology recipes.

If the test at step 630 reveals that the combination currently used is not optimum for R2R control, flow passes to step 632 where the alignment mark optimizer is run again, similar to step 604 and step 622. At step 634, an alignment mark type Q is identified as the result of the optimizer step 632. In the inner feedback loop described above, alignment mark types that do not result in optimized alignment and metrology performance are considered and eliminated from consideration. By contrast, in the outer loop, all available mark types are considered, to try and seek an effective combination. At step 636, a new R2R control strategy S+1 is found by one of the modules identified above, and control passes back to 625. Given the new alignment mark type and run-to-run control strategy, an optimum metrology target and optimum metrology recipe are determined again.

Recall that the criteria for selection in the set-up phase (original step 610) were Printability, Accuracy, and Robustness. In the production phase, additional information about the performance of the method over a number of lots is now available. Therefore, in revising the optimum metrology target type in step 625 an additional criterion can be applied: Stability. In other words, the optimal metrology target and or metrology recipe might be slightly different to the one previously chosen, when one takes into account that the performance measurements will be used in a different feedback strategy.

Flow continues around the optimization process for as many iterations as are required to pass the test at step 630. At 640, a complete optimized set of parameters for controlling the production process or output, including the optimum combination of alignment mark, alignment tree, alignment recipe, metrology target, metrology recipe and run-to-run control settings. The optimization flow finishes at step 650, but the processing is repeated at desired intervals to benefit from the experience of increased processing volumes. The modules evaluating different R2R control strategies can run continuously as desired.

In addition to optimizing the R2R control strategy during the production phase, in principle the system could also revisit the selections of alignment mark types and recipes, and/or metrology target types and recipes. In principle, the sensors within the lithographic apparatus could do experiments inline. For example, the alignment sensors may already gather multi-color data for alignment marks, so that different recipes could be evaluated without additional measurement overhead. Other types of measurement may affect production throughput, and so might be performed only rarely, if at all.

Figure 7:
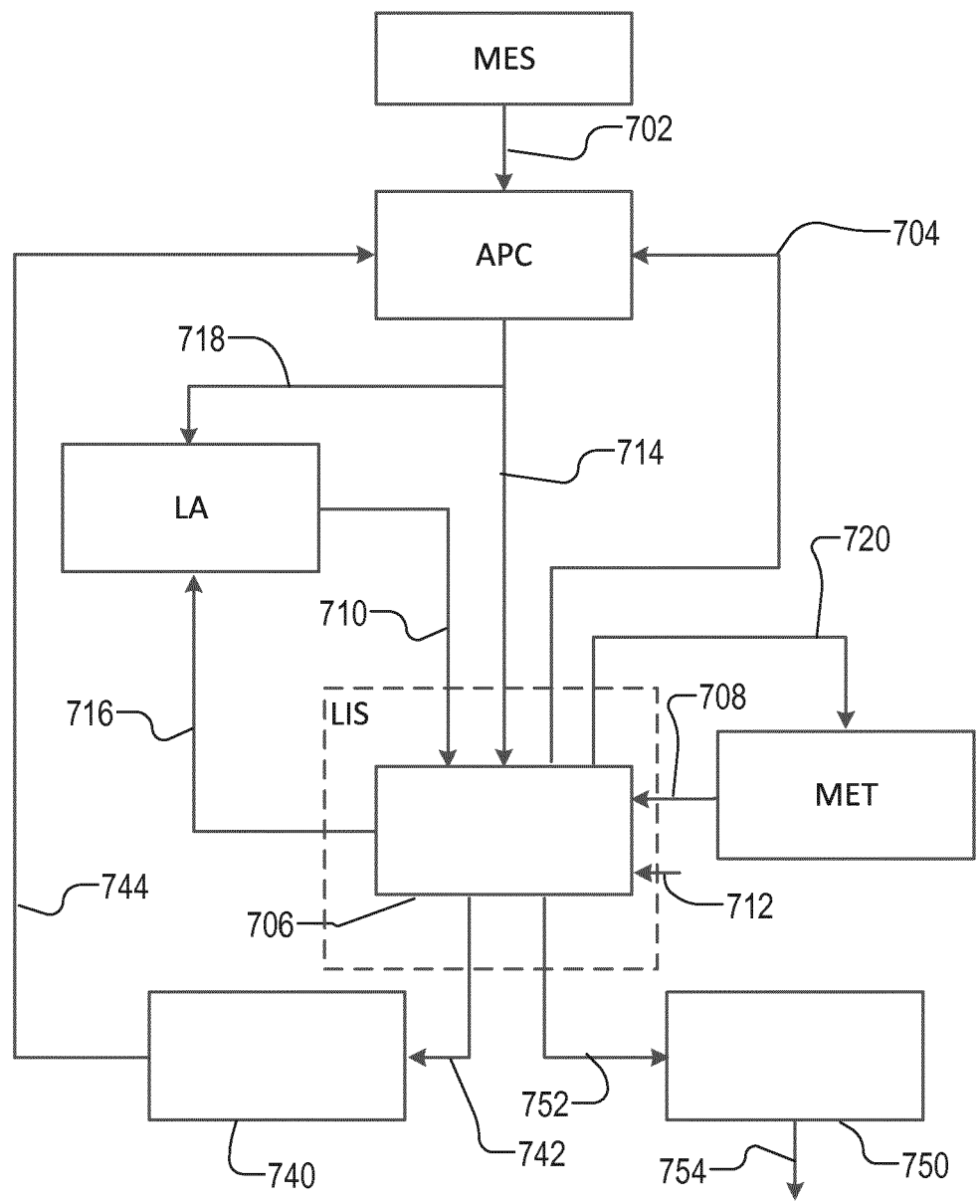
FIG. 7 illustrates the implementation of the method of FIG. 6 in the various apparatuses of a lithographic production facility.

FIG. 7 illustrates schematically the interaction of various hardware and processing components of the lithographic production facility, implementing the control systems described above. At the left and right hand sides, the lithographic apparatus LA and the metrology system MET can be seen. A manufacturing execution system MES is provided which issues a command 702 to the supervisory control system SCS of the lithocell to begin processing a given lot (batch) of wafers. Although only a single lithographic apparatus LA is shown in this diagram, the same supervisory control system in practice will operate with at least a cluster of lithographic apparatuses, working in parallel in a high-volume manufacturing environment. Using the various control loops described relation to FIG. 3 above, process corrections can be applied across all the apparatuses, in addition to corrections specific to each individual tool.

In FIG. 7 an advanced process control module APC is shown separately from the manufacturing execution system MES and from a lithography information system LIS. These systems can be regarded as components within the supervisory control system SCS shown in FIG. 2. They can be implemented in a common computing system, or they can be separate systems in practice. The APC system may for example be provided and run by a production facility operator and/or metrology equipment supplier, while the other elements of the SCS are more closely integrated with and supplied with the lithographic apparatus. In FIG. 7, an advanced process control system APC uses historic performance data 704 and context data about the present lot, to calculate process corrections 714 in accordance with an active R2R control strategy. These process corrections 714 are supplied to the lithographic apparatus. An optimization module 706 within the LIS receives overlay data 708 from metrology system MET after wafers have been processed through the lithocell. Optimization module 706 responds to the overlay data by requesting from the lithographic apparatus reports 710 of the corresponding alignment data that were gathered during processing of the same wafers. These alignment data include not only position measurements derived from the alignment sensors, but the raw signal data for different colors, polarizations etc. which is kept for certain time after alignment marks have been measured.

Together with context information 714 received from APC module, the optimization module 706 has the information required to perform the methods of FIG. 6, including the in-line process of the run-to-run feedback control. The context information may include for example APC reset signals, and information which assigns different lots into different "threads" having similar characteristics. In this way, several parallel product types and processes can be interleaved, with feedback loops specific to each thread. The module APC can trigger calculation of new exposure correction data at any time.

After performing the optimization method of FIG. 6, the optimization module delivers exposure correction data 716 to the lithographic apparatus for use in patterning a lot of wafers. Module APC provides process correction data 718 in accordance with performance measurements made on past wafers, and in accordance with a current run-to-run strategy. Similarly, optimization module 706 provides metrology recipe data 720 to metrology system MET to cause overlay to be measured on wafers after patterning. The results of these measurements form new historic performance data 704 for use by the module APC.

Once production is in progress, run-to-run (R2R) optimization is also performed by the outer feedback loop in FIG. 6. In the illustrated example, an in-line R2R optimization module 740 is provided, which corresponds to the second module mentioned above in relation to FIG. 6. This module runs in parallel with the production process, using real-time context data 752 provided from the lithography information system LIS. Context and performance data 752 may include for example lot reports, alignment data, which exposure corrections were used, overlay data measured, and context data from the module APC. Naturally the context data and performance data refer to wafers already processed, but they are said to be "real-time" in the sense that processing of similar lots of wafers under similar conditions is on-going, and can be influenced by the R2R optimizer within a short timescale, for example in less than an hour.

By the method described above, the in-line R2R module 740 analyses whether certain parameters of performance might have been improved by use of a different run-to-run control strategy. In the event that an alternative R2R control strategy is identified, a report 744 may be generated and passed to APC module. This report can used automatically to implement the improved strategy for future lots. The automated implementation may be fully automatic, or a prompt may be presented to a human operator to confirm the change of strategy, and/or to choose between a number of alternative strategies.

In the illustrated example, an off-line R2R optimization module 750 is shown, corresponding to the first module described above. This can be run at any time, whereupon it will trigger the LIS to deliver historic context and performance data 752 including for example lot reports, alignment data, which exposure corrections were used, overlay data measured, and context data from the module APC. A report 754 is produced, evaluating alternative R2R control strategies.

If by either of these modules 740, 750 it is found that all strategies are unstable, the system could trigger (or prompt) a re-run of the inner loops including steps 622 and 625, using production data and possibly extra measurements to seek alternative position measurement mark types and recipes and/or alternative metrology targets types and recipes.

Conclusion

By the techniques disclosed herein, the currently existing methods for optimizing the design and use of alignment marks and metrology targets can be improved. Co-optimization is performed, to obtain a more optimal combination of marks and settings. Not only is the optimum combination obtained more reliably, but it can be obtained far more quickly than with known techniques. The optimal combination can be determined based on any combination of performance parameters of interest, for example overlay and/or focus.

While the co-optimization is performed by sequentially revising alignment marks and metrology targets in the example method of FIG. 6, this sequential approach is not essential. In other embodiments, revising of alignment mark type and metrology mark type can be combined into a single co-optimization calculation. Accordingly the claim should not be interpreted as requiring a strictly sequential approach.

The method can be integrated easily into existing development process, and into the ongoing advanced process control loops. New hardware is not required, to achieve improved performance.

In association with the hardware of the lithographic apparatus and the lithocell LC, an embodiment may include a computer program containing one or more sequences of machine-readable instructions for causing the processors of the lithographic manufacturing system to implement methods of model mapping and control as described above. This computer program may be executed for example in a separate computer system employed for the image calculation/control process. Alternatively, the calculation steps may be wholly or partly performed within a processor a metrology tool, and/or the control unit LACU and/or supervisory control system SCS of FIGS. 1 and 2. There may also be provided a data storage medium (e.g., semiconductor memory, magnetic or optical disk) having such a computer program stored therein in non-transient form.

The invention may further be described using the following clauses:

1. A method of controlling a patterning process comprising:
   (a) measuring positions of a number of position measurement marks provided on a substrate;
   (b) using the measured positions to define a substrate correction;
   (c) using the substrate correction in controlling the patterning process to apply a pattern to the substrate;
   (d) using a number of performance measurement targets included in the applied pattern, for measuring a performance parameter of the patterning process; and
   (e) after processing a number of substrates, using the measured performance parameters to calculate a process correction and using the process correction together with the substrate correction in step (c),
   wherein the method further comprises, in a set-up phase,
   (i) selecting a type of position measurement mark for the patterning process from among a plurality of candidate mark types by reference to expected parameters of the patterning process;
   (ii) applying a test pattern to a number of substrates using the patterning process, the test pattern including a plurality of candidate types of performance measurement targets; and
   (iii) selecting a preferred candidate type of performance measurement target by comparing performance of the patterning process as measured using the different types of performance measurement targets with performance of the patterning process measured by other means,
   and wherein the method in the set-up phase yet further comprises:
   (iv) based on the measurements of position measurement marks and performance measurement targets after actual performance of the patterning process in step (ii), revising the selection of position measurement mark type used for controlling the patterning process in step (c).
2. A method according to clause 1, wherein a plurality of candidate mark types are provided on each substrate at least during the set-up phase.
3. A method according to clause 1 or 2, wherein the step (i) and/or (iv) further comprises selecting between different recipes for a position measurement method, in addition to selecting between different types of position measurement mark.
4. A method according to clause 1, 2 or 3, wherein step (ii) includes selecting one or more candidate types of performance measurement target for the patterning process from among a plurality of types by reference to expected parameters of the patterning process;
5. A method according to any preceding clause, wherein the method in the set-up phase yet further comprises:
(v) based on the measurements of position measurement marks and performance measurement targets after actual performance of the patterning process in step (ii), revising the selection of performance measurement target type used for controlling the patterning process in step (c).
6. A method according to any preceding clause, wherein the step (ii) and/or (v) further comprises selecting between different recipes for a performance measurement method, in addition to selecting between different types of performance measurement targets.
7. A method according to any preceding clause, wherein in the step (e) in a production phase said process correction is progressively updated in response to measured performance parameters from newly processed substrates, in accordance with a selected performance feedback strategy.
8. A method according to clause 7, further comprising:
(vi) in parallel with controlling performance of the patterning process using the selected performance feedback strategy, calculating alternative process corrections according to one or more alternative performance feedback strategies, and
(vii) comparing achieved performance of the patterning process using the selected performance feedback strategy with simulated performance of the patterning process using the alternative performance feedback strategies and switching to an alternative performance feedback strategy whose simulated performance would have been better than the achieved performance.
9. A method according to clause 8, further comprising:
(viii) after switching to an alternative performance feedback strategy, revising the selection of the preferred candidate type of performance measurement target by comparing stability of the new performance feedback strategy patterning process as measured using the different types of performance measurement mark.
10. A method of controlling a patterning process wherein performance measurement targets are used to measure performance of the patterning process after processing a number of substrates, wherein the method further comprises, in a set-up phase,
(i) selecting a type of position measurement mark for the patterning process from among a plurality of candidate mark types by reference to expected parameters of the patterning process;
(ii) applying a test pattern to a number of substrates using the patterning process, the test pattern including a plurality of candidate types of performance measurement targets; and
(iii) selecting a preferred candidate type of performance measurement target by comparing performance of the patterning process as measured using the different types of performance measurement targets with performance of the patterning process measured by other means,
and wherein the method in the set-up phase yet further comprises:
(iv) based on the measurements of position measurement marks and performance measurement targets after actual performance of the patterning process in step (ii), revising a selection of position measurement mark type used in the patterning process for measuring positional deviations across the substrate.
11. A method of controlling a patterning process wherein after processing a number of substrates, measured performance parameters are used to calculate a process correction, the process correction being used in applying a pattern to a series of new substrates, and wherein said process correction is progressively updated in response to measured performance parameters from newly processed substrates, in accordance with a selected performance feedback strategy, the method further comprising:
(i) in parallel with controlling performance of the patterning process using the selected performance feedback strategy, calculating alternative process corrections according to one or more alternative performance feedback strategies, and
(ii) comparing achieved performance of the patterning process using the selected performance feedback strategy with simulated performance of the patterning process using the alternative performance feedback strategies and switching to an alternative performance feedback strategy whose simulated performance would have been better than the achieved performance.
12. A control system for a lithographic apparatus, the control system comprising:
storage for historical performance measurements representing performance of a patterning process in applying patterns to a plurality of prior substrates; and
a processor for using said historical performance measurements together with position measurements made on a current substrate to control a patterning process,
the control system further comprising in an optimization system:
a module for selecting a type of position measurement mark for the patterning process from among a plurality of candidate mark types by reference to expected parameters of the patterning process;
a module for selecting a preferred candidate type of performance measurement target from among a plurality of candidate types of performance measurement targets applied to one or more substrates by comparing performance of the patterning process as measured using the different types of performance measurement targets with actual performance of the patterning process measured by other means, and
a module based on the measurements of position measurement marks and performance measurement targets after actual performance of the patterning process for revising the selection of position measurement mark type used for measuring positional deviations across the substrate.
13. A method of manufacturing devices wherein device features and metrology targets are formed on a series of substrates by a patterning process, wherein properties of the metrology targets on one or more processed substrates are measured by a method according to any of clauses 1 to 12, and wherein the measured properties are used to adjust parameters of the patterning process for the processing of further substrates.

14. A lithographic apparatus including a measurement system, a patterning system and a control system, the control system being according to clause 12.

15. A computer program product containing one or more sequences of machine-readable instructions for implementing the steps of a method of any of clauses 1 to 11.

16. A computer program product containing one or more sequences of machine-readable instructions for causing a processing device or system of processing devices to implement the control system of clause 12.

Although specific reference may have been made above to the use of embodiments of the invention in the context of optical lithography, it will be appreciated that the invention may be used in other patterning applications, for example imprint lithography. In imprint lithography, topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of controlling a patterning process for applying patterns to substrates, the method comprising:
measuring a position of each of a number of position measurement marks provided on a substrate;
using the measured positions to define a substrate correction;
using the substrate correction in controlling the patterning process to apply a pattern to the substrate;
using a number of performance measurement targets included in the applied pattern, for measuring a performance parameter of the patterning process; and
after processing a number of substrates, using the measured values of the performance parameter to calculate a process correction for the patterning process and using the process correction together with the substrate correction in controlling the patterning process,
wherein the method further comprises, in a set-up phase,
(i) selecting a type of position measurement mark for the patterning process from among a plurality of candidate mark types by reference to expected parameters of the patterning process;

(ii) applying a test pattern to a number of substrates using the patterning process, the test pattern including a plurality of candidate types of performance measurement targets;
(iii) selecting a preferred candidate type of performance measurement target by comparing performance of the patterning process as measured using the different types of performance measurement targets with another measured performance of the patterning process; and
(iv) based on measurements of position measurement marks and performance measurement targets after actual performance of the patterning process in step (ii), revising the selection of position measurement mark type used for controlling the patterning process.

2. The method as claimed in claim 1, wherein two or more candidate mark types of the plurality of candidate mark types are provided on each substrate at least during the set-up phase.

3. The method as claimed in claim 1, wherein the step (i) and/or (iv) further comprises selecting between different recipes for a position measurement method, in addition to selecting the position measurement mark.

4. The method as claimed in claim 1, wherein the step (ii) includes selecting one or more candidate types of performance measurement target for the patterning process from among a plurality of types by reference to expected parameters of the patterning process.

5. The method as claimed in claim 1, wherein the method in the set-up phase further comprises, based on the measurements of position measurement marks and performance measurement targets after actual performance of the patterning process in the step (ii), revising the selection of performance measurement target type used for controlling the patterning process.

6. The method as claimed in claim 1, wherein the step (iii) further comprises selecting between different recipes for a performance measurement method, in addition to selecting the performance measurement target.

7. The method as claimed in claim 1, wherein, in a production phase, the process correction is progressively updated in response to measured performance parameters from newly processed substrates, in accordance with a selected performance feedback strategy.

8. The method as claimed in claim 7, further comprising:
in parallel with controlling performance of the patterning process using the selected performance feedback strategy, calculating alternative process corrections for the patterning process according to one or more alternative performance feedback strategies, and
comparing achieved performance of the patterning process using the selected performance feedback strategy with simulated performance of the patterning process using the one or more alternative performance feedback strategies and switching to an alternative performance feedback strategy whose simulated performance would have been better than the achieved performance.

9. The method as claimed in claim 8, further comprising, after switching to an alternative performance feedback strategy, revising the selection of the preferred candidate type of performance measurement target by evaluating stability of the new performance feedback strategy patterning process as measured using the different types of performance measurement mark.

10. A method of controlling a patterning process wherein performance measurement targets are used to measure performance of the patterning process after processing a number of substrates, wherein the method further comprises, in a set-up phase, selecting a type of position measurement mark for the patterning process from among a plurality of candidate mark types by reference to expected parameters of the patterning process;

applying a test pattern to a number of substrates using the patterning process, the test pattern including a plurality of candidate types of performance measurement targets;

selecting a preferred candidate type of performance measurement target by comparing performance of the patterning process as measured using the different types of performance measurement targets with another measured performance of the patterning process;

based on measurements of position measurement marks and performance measurement targets after actual performance of the patterning process to apply the test pattern to the number of substrates, revising a selection of position measurement mark type used in the patterning process for measuring positional deviations across the substrate.

11. A method of controlling a patterning process wherein after processing a number of substrates, measured performance parameters are used to calculate a process correction for the patterning process, the process correction used in applying a pattern to a series of new substrates, and wherein the process correction is progressively updated in response to measured performance parameters from newly processed substrates, in accordance with a selected performance feedback strategy, the method further comprising:

in parallel with controlling performance of the patterning process using the selected performance feedback strategy, calculating alternative process corrections for the patterning process according to one or more alternative performance feedback strategies, and comparing achieved performance of the patterning process using the selected performance feedback strategy with simulated performance of the patterning process using the one or more alternative performance feedback strategies and switching to an alternative performance feedback strategy from the one or more alternative performance feedback strategies, whose simulated performance would have been better than the achieved performance.

12. A control system for a lithographic apparatus, the control system comprising:

storage for historical performance measurements representing performance of a patterning process in applying patterns to a plurality of prior substrates;

a processor system; and a non-transitory medium comprising instructions therein, the instructions, upon execution by the processor system, configured to cause the processor system to at least:

use the historical performance measurements together with position measurements made on a current substrate to control the patterning process;

select a type of position measurement mark for the patterning process from among a plurality of candidate mark types by reference to expected parameters of the patterning process;

select a preferred candidate type of performance measurement target from among a plurality of candidate types of performance measurement targets applied to one or more substrates by comparing performance of the patterning process as measured using the different types of performance measurement targets with another measured performance of the patterning process; and revise, based on measurements of position measurement marks and performance measurement targets after actual performance of the patterning process, the selection of position measurement mark type used for measuring positional deviations across the substrate.

13. A lithographic apparatus including a measurement system, a patterning system and the control system as claimed in claim 12.

14. The control system of claim 12, wherein two or more candidate mark types of the plurality of candidate mark types are provided on each substrate of the one or more substrates.

15. The control system of claim 12, wherein the instructions are further configured to cause the processor system to select between different recipes for a position measurement method using a selected position measurement mark.

16. The control system of claim 12, wherein the instructions are further configured to cause the processor system to select one or more candidate types of performance measurement target for the patterning process from among a plurality of types by reference to expected parameters of the patterning process.

17. The control system of claim 12, wherein the instructions are further configured to cause the processor system to, based on the measurements of position measurement marks and performance measurement targets after actual performance of the patterning process, revise the selection of performance measurement target type used for controlling the patterning process to apply patterns to one or more substrates.

18. The control system of claim 12, wherein the instructions are further configured to cause the processor system to select between different recipes for a performance measurement method using a selected performance measurement target.

19. The control system of claim 12, wherein the instructions are further configured to cause the processor system to, in a production phase, progressively update a process correction to the patterning process in response to measured performance parameters from newly processed substrates, in accordance with a selected performance feedback strategy.

20. A non-transitory computer program product containing one or more sequences of machine-readable instructions that, when executed by a processor system, are configured to cause the processor system to at least:

in a set-up phase,
(i) select a type of position measurement mark for a patterning process from among a plurality of candidate mark types by reference to expected parameters of the patterning process,
(ii) cause application of a test pattern to a number of substrates using the patterning process, the test pattern including a plurality of candidate types of performance measurement targets,
(iii) select a preferred candidate type of performance measurement target by comparing performance of the patterning process as measured using the different types of performance measurement targets with another measured performance of the patterning process, and
(iv) based on measurements of position measurement marks and performance measurement targets after actual performance of the patterning process in step (ii), revise the selection of position measurement mark type used for controlling the patterning process;

obtain a measured position of each of a number of position measurement marks of the selected position measurement type provided on a substrate;

define, based on the measured positions, a substrate correction;

use the substrate correction in control of the patterning process to apply a pattern to the substrate;

use a number of performance measurement targets included in the applied pattern, for measuring a performance parameter of the patterning process; and after processing a number of substrates, use the measured values of the performance parameter to calculate a process correction for the patterning process and use the process correction together with the substrate correction in control of the patterning process.

\* \* \* \* \*